(12) United States Patent
Lu

(10) Patent No.: US 6,774,887 B2
(45) Date of Patent: Aug. 10, 2004

(54) JOYSTICK

(75) Inventor: Kevin Lu, Hsin-Tien (TW)

(73) Assignee: Shin Jiuh Corp., Taipei Hsien (TW)

( * ) Notice: Subject to any disclaimer, the term of this patent is extended or adjusted under 35 U.S.C. 154(b) by 155 days.

(21) Appl. No.: 09/934,710

(22) Filed: Aug. 23, 2001

(65) Prior Publication Data

US 2003/0038780 A1 Feb. 27, 2003

(51) Int. Cl.$^7$ ................................................ G09G 5/08
(52) U.S. Cl. ...................................... 345/161; 345/160
(58) Field of Search ................................ 345/160, 161; 463/38; 200/5 A, 5 R, 5 D, 6 A; 74/471 XY

(56) References Cited

U.S. PATENT DOCUMENTS 4,246,452 A * 1/1981 Chandler .................... 200/5 A
5,225,831 A * 7/1993 Osborn ......................... 341/20
5,459,487 A * 10/1995 Bouton ......................... 463/37
5,689,285 A * 11/1997 Asher ......................... 345/161
6,266,046 B1 * 7/2001 Arita ......................... 345/156

* cited by examiner

Primary Examiner—Alexander Eisen
(74) Attorney, Agent, or Firm—Birch, Stewart, Kolasch & Birch, LLP

(57) ABSTRACT

A joystick 3 includes a circuit board 1, a thin film circuit 2 arranged on the circuit board 1, a joystick 3 on the thin film circuit 2, and a spacer 4 arranged between the thin film circuit 2 and the circuit board 1. By the joystick 3, the thin film circuit 2 is in contact with the circuit board 1 so that resistor are connected in parallel so as to reduce the resistance to control the direction and speed of the cursor precisely. As the rod 37 is pushed by an outer force, the pit 36 on the movable body 34 presses one of the joint points 12 and 22. Then, the joint points 12 and 22 will transfer a signal of the resistor, and thus, the movement of the control cursor can be controlled.

11 Claims, 4 Drawing Sheets

JOYSTICK

FIELD OF THE INVENTION

The present invention relates to a joystick, wherein the joystick is made by the thin film circuit so that the variation of the resistance can be changed so as to precise control the displacement and speed of the cursor.

BACKGROUND OF THE INVENTION

The prior art cursor control device is installed to a substrate and an elastic touch controlled plate is installed to be spaced with the cursor control device. The substrate and the elastic touch controlled plate are installed with a first conductive surface and a second conductive surface. The first conductive surface is installed with a common connecting wire, and the second conductive surface is a conductive surface having a property of a resistor. The periphery thereof is installed with a plurality of electric joints. The elastic touch controlled plate is installed with a touch control key which will push the first and second conductive surfaces along a force applying direction so as to be formed with a surface contact and an electric contact. Therefore, by surface contact and area of contact surface, different electric connections are formed so as to control the displacement and direction of the cursor.

Although aforesaid cursor control device may achieve a desired effect. However, by surface contact and area of contact surface, different electric connections are formed so as to control the displacement and direction of the cursor, since the resistance is too low and changes nonlinearly. Thereby, it is difficult to write the software for processing the output signal. Furthermore, move time and labor are consumed. The cursor control device is thicker and can not be combined to a conventional thin film circuit board.

SUMMARY OF THE INVENTION

Accordingly, the primary object of the present invention is to provide a joystick, wherein the joystick is made by the thin film circuit so that the variation of the resistance can be changed to precisely control the displacement and speed of the cursor.

Another object of the present invention is to provide a joystick, wherein a software about the joystick can be written easily.

Another object of the present invention is to provide a joystick, wherein the joystick can be made with a conventional keyboard.

A further object of the present invention is to provide a joystick, wherein the cost is down greatly.

To achieve above objects, the present invention provides a joystick including a circuit board, a thin film circuit arranged on the circuit board, a joystick on the thin film circuit, and a spacer arranged between the thin film circuit and the circuit board. By the joystick, the thin film circuit is in contact with the circuit board so that resistor are connected in parallel so as to reduce the resistance so as to control the direction and speed of the cursor precisely. As the rod is pushed by an outer force, the pit on the movable body presses one of the joint points. Then, the joint points will transfer a signal of the single resistor, and thus, the movement of the control cursor can be controlled.

The various objects and advantages of the present invention will be more readily understood from the following detailed description when read in conjunction with the appended drawing.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
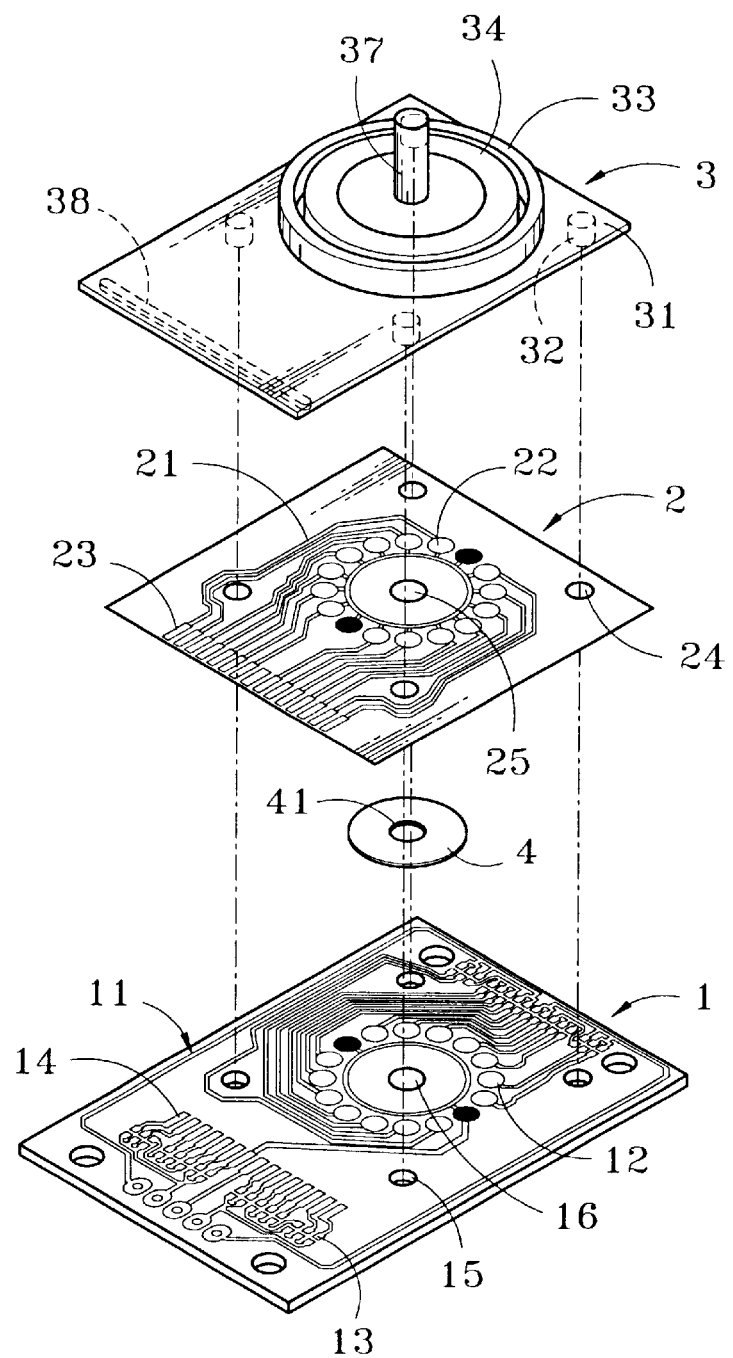
FIG. 1 is an exploded schematic view of the joystick of the present invention.
Figure 2:
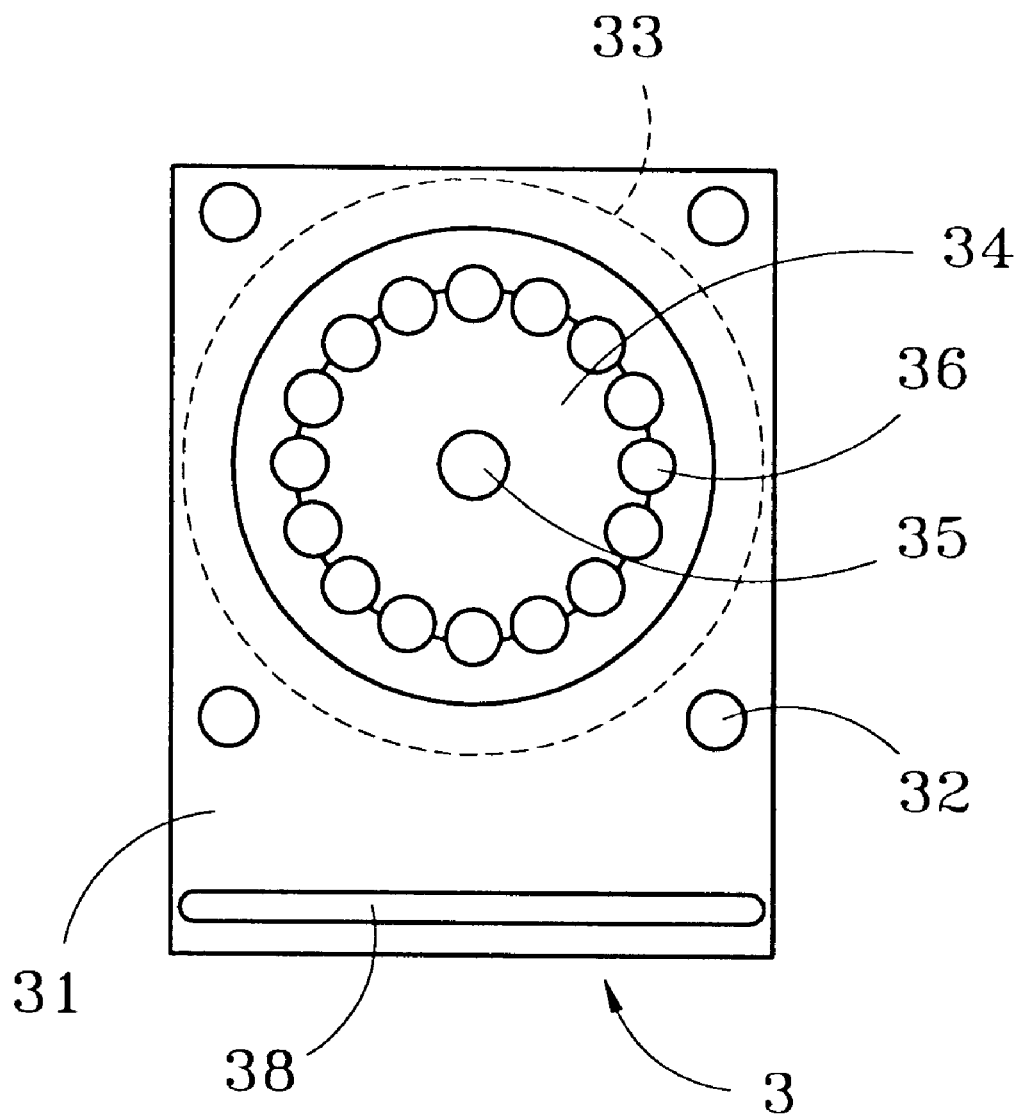
FIG. 2 is another schematic view of the joystick is FIG. 1.

Referring to FIGS. 1 to 2, an exploded view of the joystick of the present invention and a lateral schematic view of the joystick are illustrated. As shown in the figures, the present invention includes a circuit board 1, a thin film circuit 2 arranged on the circuit board 1, a joystick 3 on the thin film circuit 2, and a spacer 4 arranged between the thin film circuit 2 and the circuit board 1. By the joystick 3, the thin film circuit 2 is in contact with the circuit board 1 so that resistor are connected in parallel so as to reduce the resistance so as to control the direction and speed of the cursor precisely.

The above circuit board 1 is installed with a wire 11. The wire 11 has a plurality of joint points 12 arranged circularly. Each joint point 12 is connected to a welding point 13 having a welded resistor (not shown). When the resistor is welded to the welding point 13, it is serially connected to the joint point 12. One end of each welding point 13 is connected together. Each of the resistors is connected in parallel. Moreover, a plurality of first positioning holes 15 for accommodating the joystick 3 are provided. A first joint hole 16 is formed at a center of the joint points 12.

The thin film circuit 2 has a wire 21 for transferring signals. The wire 12 has a plurality of joint points 22 which are arranged circularly. Each joint 22 is connected to a second joint 23. After the second joint 23 is in contact with the circuit board 1, the joint points 12 and 22 are connected in series. Moreover, the thin film circuit 2 has a second positioning hole 24 on the first positioning hole 15. The center of the circle formed by the joints 22 has a second joint hole 25 arranged with respect to the second joint hole 16.

The joystick 3 is made of rubber and has a bottom 31. The bottom 31 has a protrusion 32 passing through the first positioning hole 15 and the second positioning hole 24. The surface of the bottom 31 has a protruded solid portion 33. The solid portion 33 is connected to a moveable body 34. The center of the moveable body 34 has a protrusion 35 connected to the first and second joint holes 16, 25. The outer edge thereof is formed with pits 36 with respect to the joint points 12 and 22. When the protrusion 35 moves in the moveable body 34, the pits 36 on the moveable points 34 can press on the joint points 12 and 22 of the thin film circuit 2 and the circuit board 1 precisely. The moveable body 34 enclosing a rod 37 linked to the moveable body 34. One end of the bottom 31 has a press 38. The press 38 press the second joint 23 of the thin film circuit 2. The second joint 23 is steadily jointed to the first joint 14.

The spacer 4 is arranged on the centers of the joint points 12 and 22 of the thin film circuit 2 and the circuit board 1. The spacer 4 has a third joint hole 41 with respect to the first and second joint holes 16, 25. Therefore, a new joystick is formed.

Figure 3:
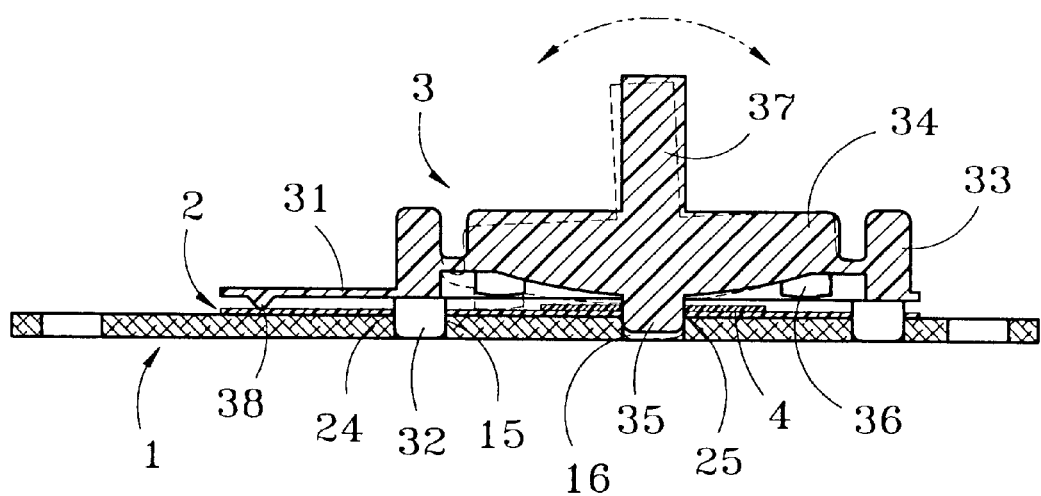
FIG. 3 is a schematic view showing the operation of the FIG. 1.
Figure 4:
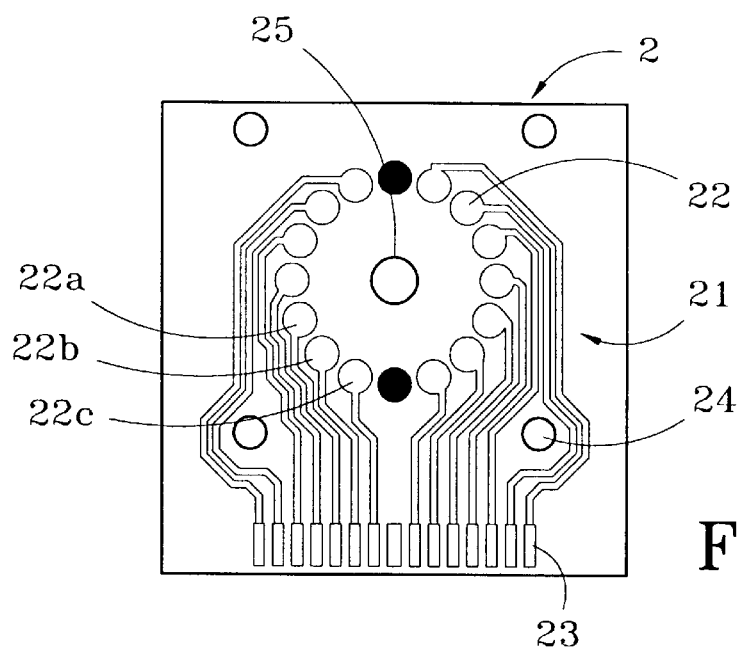
FIG. 4 is a front schematic view of the thin film circuit in FIG. 1.
Figure 5:
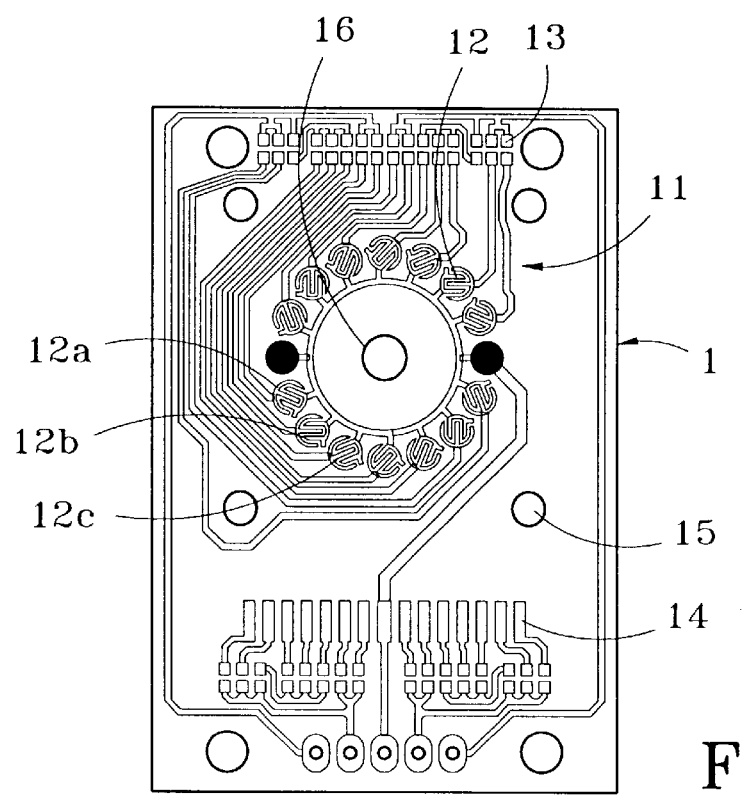
FIG. 5 is a front schematic view of the circuit board in FIG. 1.

Referring to FIGS. 3, 4, and 5, a lateral view of FIG. 1 and the front schematic view of the circuit board 1 are illustrated. As shown in Figures, after the circuit board 1, thin film circuit 2 and joystick 3 are assembled, as the rod 37 is pushed by an outer force, the pit 36 on the movable body 34 presses one of the joint points 12 and 22. Then, the joint points 12 and 22 will transfer a signal of the single resistor, and thus, the movement of the control cursor can be controlled.

If the two pits 36 of the movable body 34 press the joints 12a, 12b, 22a and 22b. The joints 12a, 12b, 22a and 22b will cause the two resistors connected in parallel so as to reduce the resistors such as 10 ohm ∥ 10 ohm=5 ohm). Then, the transferring signal is the signal of two parallel resistors.

If three pits of the movable body 34 press on the three joints 12a, 12b, 12c, 22a, 22b and 22c. The three joints 12a, 12b, 12c, 22a, 22b and 22c will cause the three resistors connected in parallel. The resistance is further reduced. Then the transferring signal is the signal of three parallel resistors.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A joystick comprising:
a circuit board installed with a wire, the wire having a plurality of first joint points arranged circularly, each of the first joint points being connected to a welding point, one end of each of the welding points being connected together to form a parallel circuit, the circuit board having a plurality of first positioning holes for accommodating the joystick;
a thin film circuit having a wire for transferring signals, the wire of the thin film circuit having a plurality of second joint points which are arranged circularly and each of the second joint points being connected to a joint on the thin film circuit; and
a joystick having a bottom with a protruded solid portion, the solid portion being connected to a movable body, the outer edge thereof being formed with pins aligned with the first and second joint points, the movable body enclosing a rod linked to the movable body, the rod being pushed by an outer force, the pin on the movable body pressing one of the second joint points to bring it into contact with a corresponding one of the first joint points whereafter the joint points will transfer a signal to control movement of a control cursor.

2. The joystick as claimed in claim 1, wherein the circuit board has a joint connected to the joint on the thin film circuit.

3. The joystick as claimed in claim 1, wherein the thin film circuit has at least one positioning hole which is located in a position to correspond to one of the first positioning holes of the circuit board.

4. The joystick as claimed in claim 1, wherein the joystick is made of rubber.

5. The joystick as claimed in claim 1, wherein the bottom of the joystick has a protrusion passing through first and second positioning holes.

6. The joystick as claimed in claim 1, wherein the rod is made of plastic.

7. The joystick as claimed in claim 1, wherein one end of the bottom of the joystick has a press which presses the joint of the thin film circuit so that the joint is steadily connected to a joint of the circuit board.

8. The joystick as claimed in claim 1, wherein a lower end of the movable body has a protrusion.

9. The joystick as claimed in claim 8, wherein the circuit board, the thin film circuit and a spacer have a first, a second and a third joint holes respectively for positioning the protrusion of the movable body.

10. The joystick as claimed in claim 1, further comprising a spacer provided between the thin firm circuit and the circuit board.

11. The joystick as claimed in claim 10, wherein the spacer has an aperture which is aligned with centers of the circular arrangements of the first and second joint points.

* * * * *